United States Patent
Li

(10) Patent No.: US 9,264,215 B2
(45) Date of Patent: Feb. 16, 2016

(54) TRANSMISSION PROTOCOL DECODING METHOD, DEVICE, AND TRANSMISSION PROTOCOL DECODING CHIP

(71) Applicant: SHENZHEN SUNMOON MICROELECTRONICS CO., LTD., Shenzhen, Guangdong (CN)

(72) Inventor: Zhaohua Li, Guangdong (CN)

(73) Assignee: SHENSHEN SUMOON MICROEELECTRONIDA,LTD., Guangdong (CN)

( * ) Notice: Subject to any disclaimer, the term of this patent is extended or adjusted under 35 U.S.C. 154(b) by 51 days.

(21) Appl. No.: 14/351,137

(22) PCT Filed: Jan. 10, 2014

(86) PCT No.: PCT/CN2014/070454
§ 371 (c)(1),
(2) Date: Apr. 10, 2014

(87) PCT Pub. No.: WO2015/058473
PCT Pub. Date: Apr. 30, 2015

(65) Prior Publication Data
US 2015/0117578 A1    Apr. 30, 2015

(30) Foreign Application Priority Data

Oct. 25, 2013   (CN) .......................... 2013 1 0513788
Oct. 25, 2013   (CN) ....................... 2013 2 0665885 U

(51) Int. Cl.
H04L 7/00   (2006.01)
H04L 7/04   (2006.01)
H04L 5/00   (2006.01)
H05B 37/02  (2006.01)
H03K 23/68  (2006.01)

(52) U.S. Cl.
CPC .............. *H04L 7/0079* (2013.01); *H04L 7/044* (2013.01); *H03K 23/68* (2013.01); *H04L 5/00* (2013.01); *H05B 37/0254* (2013.01)

(58) Field of Classification Search
CPC ... H04L 27/2662; H04L 7/041; H04L 7/0079; H04L 69/18; H04L 2027/0016; H04L 7/0331; H04L 5/00; H04L 7/0044; H05B 37/0254; H03K 23/68
USPC ................. 375/354, 355, 365, 375, 368, 366; 327/141; 713/500; 714/707
See application file for complete search history.

(56) References Cited

U.S. PATENT DOCUMENTS 6,072,534 A * 6/2000 Dell'ova ................ H03K 4/026
                                                    327/115
2001/0001616 A1* 5/2001 Rakib ................. H03M 13/256
                                                    375/259

* cited by examiner

*Primary Examiner* — Rahel Guarino
(74) *Attorney, Agent, or Firm* — Rankin, Hill & Clark LLP

(57) ABSTRACT

A transmission protocol decoding method, device, and a transport protocol decoder chip are provided for generating an oscillation signal; detecting a frame start signal, and outputting a sampling control signal when the frame start signal is detected; counting an oscillation period of the oscillation signal within a time period of low level bits of a frame start byte to obtain a count value after receiving the control signal, and then processing a division operation to the count value to output a quotient and a remainder; determining a sampling period according to the quotient and the remainder to generate a sampling pulse, and then decoding a data byte of a transmission data according to the sampling pulse.

9 Claims, 5 Drawing Sheets

TRANSMISSION PROTOCOL DECODING METHOD, DEVICE, AND TRANSMISSION PROTOCOL DECODING CHIP

TECHNICAL FIELD

The present invention relates to a field of communication, particularly to a transmission protocol decoding method, device, and a transmission protocol decoding chip.

BACKGROUND

With the utilization and popularization of digital technology and computer technology, a computer lighting console appears, and subsequently analog and digital communication protocols, for example, D54, AVAB, CMX, PMX, EMX, appears. However, the above mentioned protocol standards are the ones made by various manufacturers, the compatibility among the protocol standards is poor and there is problem about interchangeability among devices. In order to solve the problem about the interchangeability of devices made by different manufacturers, a DMX512 protocol is developed in the early 1980s by United State Institute for Theatre Technology (USITT). The DMX512 protocol is digital multiplex protocol. After formulated and modified, the DMX512 protocol is further developed and formed the DMX512-1990 by the USITT. Now, this control protocol is supported by almost all of the lighting and stage equipment manufacturers, and is widely used as a digital lighting data protocol, so the DMX512-1990 has become the international standard of the lighting control.

The Unified DMX512 protocol makes devices of different manufacturers can connect with each other, and thus the compatibility is greatly improved. Meanwhile, the DMX512 protocol transmits digital signal in serial, and only one signal cable is needed between a console and an equipment, which greatly simplifies the connection cable between the console and the device.

The DMX512 protocol adjusts luminance of lighting equipments by sending data packet on the bus. Extremely stringent rules are done to the timing sequence of each part of the packets according to the DMX512 protocol. Each byte has 11 data bits, wherein, one bit is low level start bit, eight bits are data bits, and two bits are high level stop bits. One frame includes luminance data of one address, so the first frame is the data of the first address, the second frame is the data of the second address, and so 512 frames can transmit data of 512 addresses. Timing sequences of the DMX512 are as shown in FIG. 1.

The details are described in the following table:

| number | describe | slot requirements |
|---|---|---|
| 1 | frame start or frame end | 88 us |
| 2 | frame start flag | 8 us |
| 3 | a whole byte | 11 bits data |
| 4 | byte start flag, required to "0" | 1 bit data |
| 5 | LSB of a byte | 1 bit data |
| 6 | MSB of a byte | 1 bit data |
| 7 | byte end flag, required to "1" | 1 bit data |
| 8 | byte end flag, required to "1" | 1 bit data |
| 9 | time width between adjacent bytes, required to "1" | <1 s |
| 10 | time width between adjacent frames, required to "1" | <1 s |
| 11 | start byte data of per frame data, required to "0" | 8 bits data |
| 12 | one byte data, host sending, slave machine receiving | 8 bits data |
| 13 | a whole frame | — |

In the standard DMX512 protocol, the data width of each bit is fixed as 4 us, i.e. the transmission rate of the data is 250 Kbps (250 Kbits data are transmitted per second)

Existing protocol decoding method is:

determining the subsequent time width of each byte by detecting time width of the start byte of each frame. Take the standard DMX512 protocol for example, the start byte is consist of one start bit flag ("0")+eight byte data bits (eight "0")+two end flags (two "1"). In accordance with standard DMX512 protocol, the width of the start byte is 44 us. Since the nine bits "0" of the start byte are between the frame start flag ("1") and two byte end flags (two "1"), then the time width of the 9 bits "0" is better to be monitored.

One of the existing approaches is to select a sampling period based on the sample data, for example, several sampling periods T1, T2, T3 are produced by an internal oscillator, and a most suitable sampling period is selected by sampling the start byte. The method is simple, but the decoding error is large for a variety of sample data to select the same sampling period, in particular, the frequency can not be sampled within the full coverage. That is, in certain frequency bands, the data can be sampled, but within certain frequency bands, the data can not be sampled, for example, in frequency band 200~300 Kbps and 400~500 Kbps, the data can be sampled, but in frequency band 300~400 Kbps, the data can not be sampled.

Another approach is to arrange a built-in oscillator (period T) within the slave machine, the time width $T_{bit}$ of each bit is obtained by counting time of the nine bits "0" of the start byte, for example, the time is $T_{9bits}$, and then the time $T_{9bits}$ is divided by 9 to obtain the $T_{bit}$. Of course, the division operation can be carried out during the sampling process. Because a digital process manner is commonly used in sampling, the time width $T_N$, should be an integer multiple of the oscillator period N*T in order to avoid errors, but in actual situation, the N is generally obtained from $T_{9bits}/9$, so it is difficult to control the division result to be an integer, for example $T_{9bits}/9=8.6$.

Now, the common method is to reserve the integer, so for the above data, N=8 is selected, however, during the decoding of each byte, the errors will be accumulated. As shown in FIG. 1, the sampling is usually done in center position of the data byte, the position of a sampling point is N (½+1)T, so that, when the start bit of each byte is decoded, an error is [(8.6−8)/2]T=0.3T; when decoding the first data bit of each byte, error is [(8.6−8)×1.5]T=0.9T; so, when decoding the eighth data bit of each byte, the accumulated error is [(8.6−8)×8.5]T=4.1T; in particular, in an extreme case $T_{9bits}/9=8.99$, when decoding the eighth data bit of each byte, the accumulated error is 8.5T, thereby, decoding error is generated. So, the position of the sampling point generally is (N/2) T>8.5T to ensure that when decoding the eighth data bit of each byte, the data of the seventh data bit can not be sampled.

However, in order to sample the time width of the start byte more accurately, the frequency of the oscillator of the slave machine is increased continuously as high as possible. Because the higher the frequency is, the smaller the maximum accumulated error resulting from the method of reserving the integer is with respect to the sampling period. In the above example, in the standard DMX512 protocol, time width of each bit is 4 us, if N is equal to 16, then the period of the internal oscillator is 4 us/16=0.25 us, the frequency of the internal oscillator is 4 MHz.

In practical applications, more slave machines are needed to be connected to ensure the refresh rate. That is, the data transfer rate needs to be enhanced. If a higher frequency data needs to be decoded based on the above frequency of the internal oscillator, such as the decoding rate is up to 500 Kbps, then the maximum accumulated error is still 8.5T, but if N=8, the decoding may produce errors. The error can only be overcome by increasing the frequency of the internal oscillator within the chip. The frequency of the internal oscillator is increased from 4 MHz to 8 MHz, and N=16. So, if the decoding rate is up to 1 Mbps, and the frequency of the internal oscillator is at least 16 MHz. However, on the basis of the existing IC, for the frequency up to a MHZ, the higher the frequency is, the harder ensuring the stability of a chip produced at different stage is.

Therefore, the existing transmission protocol decoding method is difficult to ensure the accuracy of decoding due to the accumulated error in of the sampling period, and the method of enhancing the data transmission rate to reduce the decoding error by increasing the frequency of the internal oscillator within the chip is high cost, complicated realization and poor stability.

SUMMARY

The embodiment of the present application aims at providing a transmission protocol decoding method to solve the problem that the present decoding method will produce error caused by the accumulation of the sampling period which may lead to the problem of inaccuracy decoding, high cost, and poor stability.

The embodiment of the present application is achieved by a transmission protocol decoding method; the method includes the steps of:

generating an oscillation signal;

detecting a frame start signal, and outputting a sampling control signal when the frame start signal is detected;

counting an oscillation period of the oscillation signal within a time period of low level bits of a frame start byte to obtain a count value after receiving the sampling control signal, and then processing a division operation to the count value to output a quotient and a remainder; and determining a sampling period according to the quotient and the remainder to generate a sampling pulse, and decoding a data byte of a transmission data according to the sampling pulse.

Another object of the embodiment of the present application is to provide a transmission protocol decoding device; the device is coupled to a drive unit, and includes:

an oscillator configured to generate an oscillation signal;

a controller configured to detect a frame start signal, and output a sampling control signal when the frame start signal is detected, wherein an input terminal of the controller is configured to receive a transmission data;

a division unit configured to count the oscillation period of the oscillation signal within a time period of low level bits of a frame start byte to obtain a count value after receiving the control signal, and configured to process a division operation to the count value, and then output a quotient and a remainder, wherein a control terminal of the division unit is coupled to an output terminal of the controller, an input terminal of the division unit is coupled to an output terminal of the oscillator; and a decoding unit configured to determine a sampling period according to the quotient and the remainder to generate a sampling pulse, and configured to decode a data byte of a transmission data according to the sampling pulse, a first input terminal of the decoding unit is coupled to a first output terminal of the division unit, a second input terminal of the decoding unit is coupled to a second output terminal of the division unit, a third input terminal of the decoding unit is coupled to an input terminal of the controller to receive the transmission data, a clock terminal of the decoding unit is coupled to an output terminal of the oscillator, an output terminal of the decoding unit is coupled to the drive unit.

The further object of the embodiment of the present application is to provide a transmission protocol decoding chip used for the above transmission protocol decoding device.

In the embodiment of the present application, the oscillation period of the oscillation signal is counted within a time period of low level bits of a frame start byte to obtain a count value after receiving the control signal, and then a division operation is carried out to the count value to output a quotient and a remainder, and then the data bytes are decoded according to the quotient and the remainder, so the accumulation error can not be generated, and there is no need to enhance the data transmission rate by reducing the decoding error, which improves the accuracy of the decoding, and is simple realization, low cost and good stability.

DETAILED DESCRIPTION OF THE PREFERRED EMBODIMENTS

In order to make the objects, technique solutions, and advantages of the application clearer, the present invention will be further described hereafter with reference to the accompanied drawings and embodiments. It shall be understood that, the embodiments described herein are only intended to illustrate but not to limit the present invention.

In the embodiment of the present application, an oscillation period of the oscillation signal is counted within a time period of low level bits of a frame start byte to obtain a count value after receiving the control signal, and then a division operation is carried out to count value, and the data bytes are decoded according to a quotient and a remainder, so the accumulation error can not be generated, and the accuracy of the decoding is greatly improved.

Figure 2:
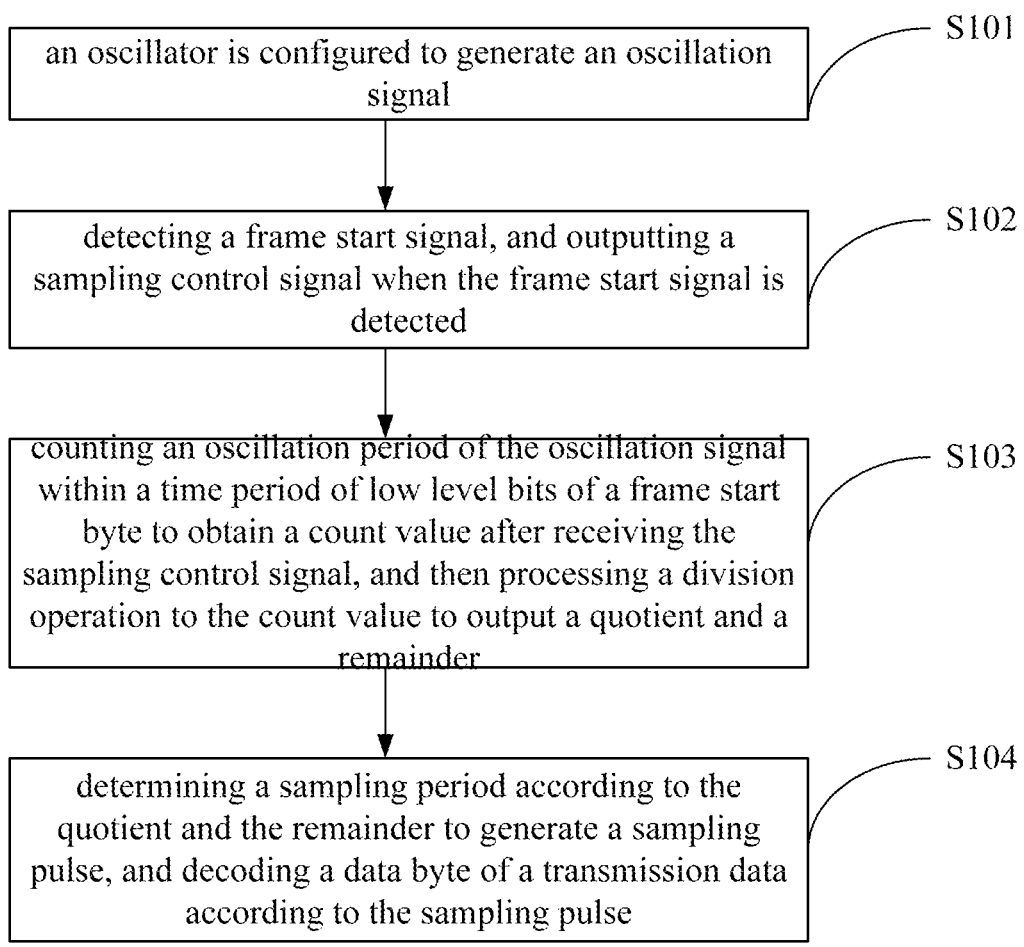
FIG. 2 is a flowchart of a transmission protocol decoding method in accordance with an embodiment of the present invention.

FIG. 2 is a flowchart of a transmission protocol decoding method in accordance with an embodiment of the present invention, for convenience of illustration, only relevant parts related to the present invention are shown.

Figure 1:
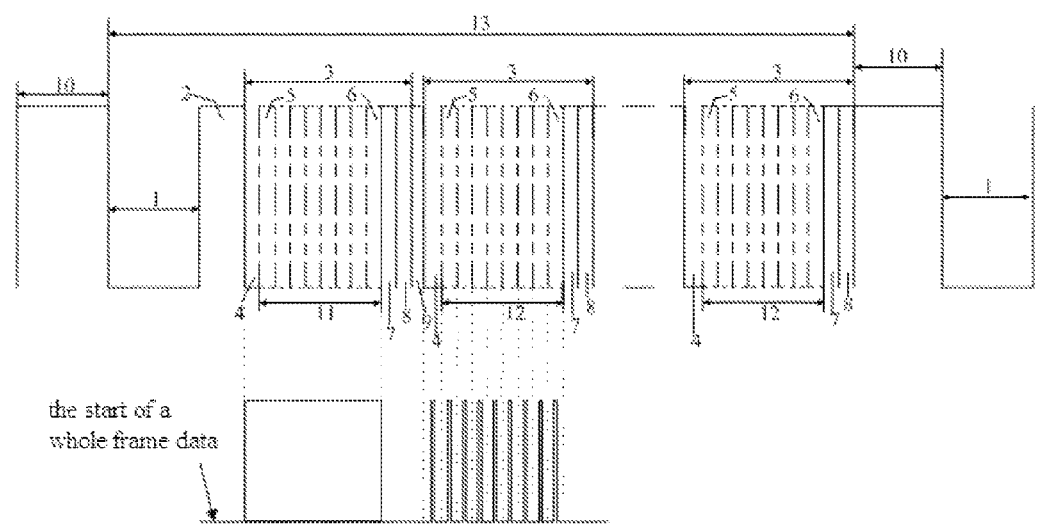
FIG. 1 is a schematic diagram of timing sequence decoding of a DMX512 protocol.

In step S101, an oscillator is configured to generate an oscillation signal OSC;

In step S102, a controller is configured to detect a frame start signal, and is configured to output a sampling control signal when the frame start signal is detected;

In the present embodiment of the application, the frame start signal is a first low level of each frame of transmission data, referring to a number 1 in the FIG. 1. The controller is configured to detect the low level time width of the frame start signal of the each frame of transmission data, the controller is used to detect a frame start signal and outputs a sampling control signal, when the time width of the low level is greater than a preset time width, for example, in a standard DMX512 protocol, the time width of the low level of the frame start signal is greater than 88 us, but for a protocol similar to the DMX512 protocol, the controller can also be configured to detect a preset time width according to the time width of the low level of the frame start signal of the protocol.

In step S103, a division unit is configured to count the oscillation period T of the oscillation signal OSC within a time period of low level bits of a frame start to obtain a count value byte after receiving the control signal, and then is configured to process a division operation to count value $N_{Kbits}$ to output a quotient and a remainder;

In embodiments of the application, the frame start byte (including one low level start bit, eight data bits, and two high level stop bits) is a first byte after the frame start signal of each frame of the transmission data, see a marked part through the first number 3 as shown in FIG. 1, the division unit counts the oscillation period T within a sampling time period of low level bits of a frame start byte after receiving the control signal, wherein, the oscillation period is used as a unit, a falling edge of the frame start byte is used as a beginning of the count, a rising edge of the frame start byte is used as an ending of the count to obtain the clock number (count value $N_{Kbits}$) corresponding to sampling time period of low level bits of a frame start byte, then, the time width of the start byte is $N_{kbits} \cdot T$, wherein T is the oscillator period.

And then, the division unit carries out a division operation to the count value $N_{Kbit}$, and outputs the quotient N and the remainder M, i.e. $N \cdot K + M = N_{kbits}$. Wherein, the K is the bit number corresponding to the low level of the frame start byte.

Take the standard DMX512 protocol as an example, the low level bits of the frame start byte of the protocol are nine bits (see FIG. 1 and Table 1), the division unit detects the time width of the frame start byte $N_{9bits} \cdot T$ after receiving the sampling control signal and the oscillation period T, wherein, the falling edge of the frame start byte is used as the beginning of the count, the oscillation period T of the oscillator output is used as the unit, the rising edge of the frame start byte is used as the ending of the count, and then $N_{9bits}$ is divided by nine to obtain the quotient N and the remainder M, thereinto $9 \cdot N + M = N_{9bits}$.

Of course, in a protocol similar to the class DMX512 protocol, the time width $N_{9bits} \cdot T$ of the low level bits of the frame start byte and bit number K corresponding to the low level can be set optionally, and bit number j corresponding to data bytes of transmission data can also be set optionally. Accordingly, the division operation is $N_{kbits} \div K$ and the results of the division operation consists of two parts, wherein, N is the quotient, M is the remainder, and $N \cdot K + M = N_{kbits}$, and M is any integer from 0 to (k−1). Data is usually sampled in the center position of a data byte, so subsequent sampling period of the start bit is (N/2) T, the sampling period within the data byte (including j bits) are $T_{samp} = T \cdot N$ or $T_{samp} = T \cdot (N+1)$, where the number of $T_{samp} = T \cdot N$ is (j−X) and the number of $T_{samp} = T \cdot (N+1)$ is X, wherein, the $X = M \cdot (j \div K)$.

In step S104, the decoding unit is configured to determine the sampling period according to the quotient and the remainder to generate a sampling pulse, and is configured to decode a data byte of the transmission data according to the sampling pulse.

In the present embodiment of the application, the decoding unit determines the sampling period according to the quotient N and the remainder M, the sampling period includes two kinds of sampling pulse intervals, then data bytes in each frame are sampled according to the two kinds of sampling pulse intervals and then the sampled data bytes are decoded, the above data bytes refer to a plurality of bytes behind the initial byte of each frame, take the standard DMX512 protocol for example, the bit number of the frame start byte are nine, the bit number of each data byte are also nine (wherein, the first bit is 1'b0). Each data byte corresponds to nine sampling pulses, the time width between pulses is controlled by N and M. Wherein, for sampling accuracy, generally data is sampled in the center position of each bit, i.e. the time interval between the sampling point of the start bit and a falling edge of the start bit of the data byte is (N/2) T, the subsequent sampling pulses interval of the eight data bits is (N+1) T or NT, wherein the number of N+1 is M, the number of N is (9−M), the sampling pulses interval can be set as (N+1) T or NT by a interpolation.

As an embodiment of the present application, the decoding unit may use a plurality of decoders, decrementers, state machines and control modules, e.g., using a first decrementer decreases the bit number j of a data byte, a second decrementer decreases the remainder M, and a third decrementer decreases the sampling period.

The state transition diagram of the state machine can be:
0000→0001→0010→0011→0100→0101→0110→0111→1000→00 00 . . . .

For example, the time width is 176T when samples to the start byte, and then the 176T is divided by 9 to obtain N=19, M=5, the binary representation of the N, M are N=5'b10011, M=4'b0101.

Figure 7:
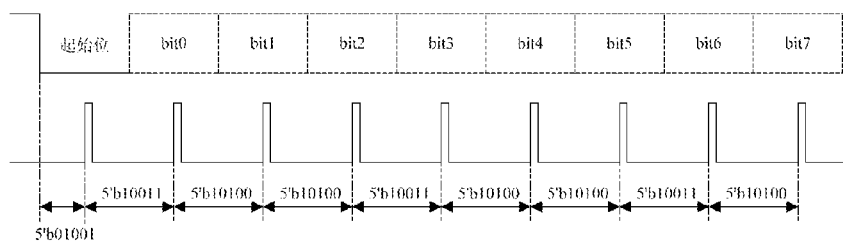
FIG. 7 is a flowchart of a transmission protocol decoding method implemented by a state machine in accordance with an embodiment of the present invention.

When samples the start bit, the sampling point is set to be 5'b01001. The subsequent sampling periods of data bits comprises five 5'b10100s and three 5'b10011s. Further, the subsequent sampling periods is distributed in a interpolation manner as far as possible, for example, the distribution of the sampling periods from the start bit to the eighth data bit are as shown in FIG. 7.

The specific sampling process are as follow: the falling edge of each data byte is used as the beginning of the sampling data, the sampling points of start bit is (N/2) T, if M=3, the interpolation is set by state machine, for example, the interval between the second sampling pulse and the first sampling pulse is (N+1) T, the interval between the third sampling pulse and the second sampling pulse is (N+1) T, the interval between the forth sampling pulse and the third sampling pulse is (N+1) T, the interval between the fifth sampling pulse and the forth sampling pulse is NT, the interval between the sixth sampling pulse and the fifth sampling pulse is NT, the interval between the seventh sampling pulse and the sixth sampling pulse is NT, the interval between the eighth sampling pulse and the seventh sampling pulse is NT, the interval between the ninth sampling pulse and the eighth sampling pulse is NT, Understandably, the sampling pulse interval of each sampling pulse can be changed by changing the state transition value of the state machine, for example, the interval between the third sampling pulse and the second sampling pulse is set as NT, the interval between the eighth sampling pulse and the seventh sampling pulse is (N+1) T, each time a sampling pulse is emitted, the first decrementer, the second decrementer, and the third decrementer decreases the data byte bits j, the remainder M, and the sampling period T.

In the embodiment of the present application, the oscillation period of the oscillation signal is counted within a time period of low level bits of a frame start byte to obtain a count value after receiving the control signal, and then a division operation is carried out to the count value to output a quotient and a remainder, the sampling period (sampling pulse interval) is determined according to the quotient and the remainder, and data bytes of each frame are sampled according to the sampling period, and then the sampled data bytes are decoded, so the accumulation error can not be generated, and there is no need to enhance the data transmission rate by reducing the decoding error, which improves the accuracy of the decoding, and is simple realization, low cost and good stability.

Figure 3:
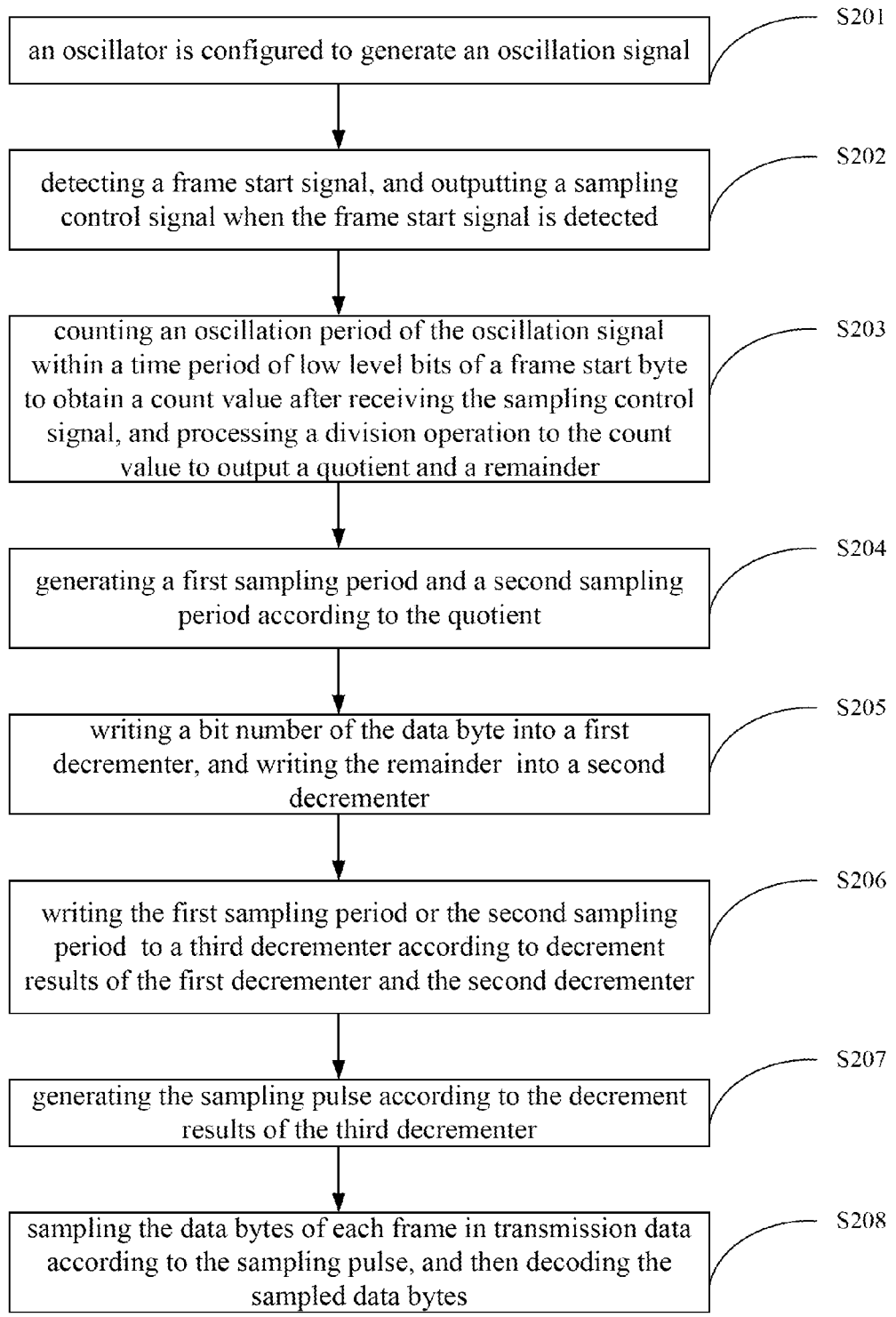
FIG. 3 is a flowchart of a transmission protocol decoding method in accordance with another embodiment of the present invention.

FIG. 3 is a flowchart of a transmission protocol decoding method in accordance with another embodiment of the present invention, for convenience of illustration, only relevant parts related to the present invention are shown.

In step 201, an oscillator is configured to generate an oscillation signal OSC;

In step 202, a controller is configured to detect a frame start signal, and is configured to output a sampling control signal when the frame start signal is detected;

In step 203, a division unit is configured to count the oscillation period T of the oscillation signal OSC within a time period of low level bits of a frame start to obtain a count value byte after receiving the control signal, and then is configured to carry out a division operation to count value $N_{Kbits}$ output a quotient and a remainder;

In step 204, generating a first sampling period and a second sampling period according to the quotient N;

In step 205, writing a bit number j of the data byte into a first decrementer, and writing the remainder M into a second decrementer;

In step 206, writing the first sampling period or the second sampling period to a third decrementer according to decrement results of the first decrementer and the second decrementer;

In step 207, generating the sampling pulse according to the decrement results of the third decrementer;

In step 208, sampling the data bytes of each frame in transmission data according to the sampling pulse, and then decoding the sampled data bytes.

In the present embodiment of the application, an initial sampling period (N/2) T is generated according to the quotient N and the period of the oscillation signal OSC, the bit number j (in this example is nine) of the data byte is written to the first decrementer, the initial sampling period (N/2) T is written to the third decrementer, the first decrementer begins to decrease 1 according to the period of the oscillation signal OSC, and the third decrementer also begins to decrease at the control of the period of the oscillation signal OSC, and outputs a first sampling pulse when the third decrementer is decreased to zero, and then the first sampling period (N+1) T and the second sampling period NT are generated according to the quotient N, and the remainder M is written to the second decrementer, the first sampling period (N+1) T or the second sampling period NT is written to the third decrementer at the control of the state machine, the second decrementer decreases 1, when the first sampling period (N+1) T is written to the third decrementer at the control of the state machine, and the third decrementer also begins to decrease after being written to the first sampling period (N+1) T or the second sampling period NT, and outputs a second sampling pulse until the third decrementer is decreased to zero, and the first sampling period (N+1) T or the second sampling period NT is written to the third decrementer again until the first decrementer is decreased to zero, and each time when the first sampling period (N+1) T is written to the third decrementer, the second decrementer decreases 1, until the second decrementer is decreased to zero, cycling as such, the number of sampling pulses j is output to complete the sampling operation of the whole data byte.

If not using the state machine, the third decrementer can first be written with the first sampling period (N+1) T, and then determines whether the value of the second decrementer is zero, if the second decrementer is not decreased to zero, the third decrementer is written with the first sampling period (N+1) T continually, until the second decrementer is decreased to zero, and then the second sampling period NT is written to the third decrementer, until the first decrementer is decreased to zero. The sampling of the data bytes is completed, when the first decrementer is decreased to zero.

Figure 4:
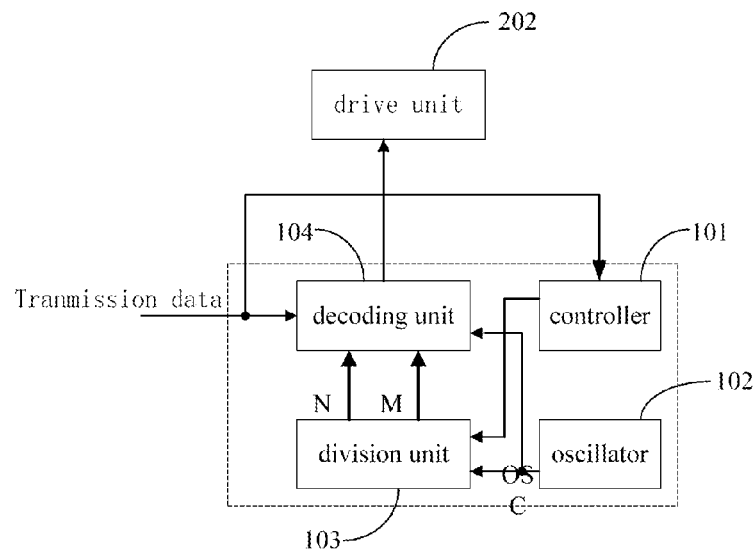
FIG. 4 is a structure view of a transmission protocol decoding device in accordance with an embodiment of the present invention.

In the embodiment of the present application, the oscillation period of the oscillation signal is counted within a time period of low level bits of a frame start byte to obtain a count value after receiving the control signal, and then a division operation is processed to the count value to output a quotient and a remainder, the sampling period (sampling pulse interval) is determined according to the quotient and the remainder, and data bytes of each frame are sampled according to the sampling period, and then the sampled data bytes are decoded, so the accumulation error can not be generated, and there is no need to enhance the data transmission rate by reducing the decoding error, which improves the accuracy of the decoding, and is simple realization, low cost and good stability FIG. 4 is a structure view of a transmission protocol decoding device in accordance with an embodiment of the present invention, for convenience of illustration, only relevant parts related to the present invention are shown.

As an embodiment of the present application, the transmission protocol decoding device is coupled to a drive unit 202 and includes:

a oscillator 102, the oscillator 102 is configured to generate an oscillation signal OSC;

In the present embodiment of the application, the oscillator 102 may be integrated within a chip, for providing an oscillation signal OSC with a preset oscillation period T, and for receiving an oscillation signal OSC with a preset oscillation period T from the outside.

a controller 101, the controller 101 is configured to detect a frame start signal, and output a sampling control signal when the frame start signal is detected, wherein an input of the controller 101 is configured to receive a transmission data;

In the present embodiment of the application, the frame start signal is a first low level of each frame of transmission data, referring to a number 1 in the FIG. 1. The controller 101 is configured to detect the low level time width of frame start signal of the each frame of transmission data, the controller is used to detect a frame start signal and outputs a sampling control signal, when the time width of the low level is greater than a preset time width As an embodiment of the present application, the controller 101 may be achieved by a state machine or a time detecting device.

a division unit 103, the division unit 103 is configured to count the oscillation period T (pulse) of the oscillation signal OSC within a time period of low level bits of a frame start byte after receiving the control signal, and then is configured to process a division operation to count value $N_{Kbits}$ to output a quotient and a remainder, wherein a control terminal of the division unit 103 is coupled to an output terminal of the controller 101, an input terminal of the division unit 103 is coupled to an output terminal of the oscillator 102;

In embodiments of the application, the frame start byte is a first byte after the frame start signal of each frame of the transmission data, the division unit 103 counts the oscillation period T within a sampling time period of low level bits of a frame start byte after receiving the control signal, wherein, the oscillation period is used as a unit, a falling edge of the frame start byte is used as a beginning of the count, a rising edge of the frame start byte is used as an ending of the count to obtain the clock number (count value $N_{kbits}$) corresponding to the sampling time period of low level bits of a frame start byte, and the division unit 103 carries out a division operation to the count value $N_{Kbit}$, and outputs the quotient N and the remainder M, i.e. $N \cdot K+M=N_{kbits}$. Wherein, the K is the bits number corresponding to the low level of the frame start byte, so, the time width of the start byte is $N_{kbits} \cdot T$, wherein T is the oscillator period.

As an embodiment of the present application, the division unit 103 may be achieved through a divider and a counter.

A decoding unit 104, the decoding unit 104 is configured to determine the sampling period according to the quotient and the remainder to generate a sampling pulse, and is configured to decode a data byte of a transmission data according to the sampling pulse, wherein a control terminal of the decoding unit 104 is coupled to the output terminal of the controller 101, a first input terminal of the decoding unit 104 is coupled to a first output of the division unit 103, a second input terminal of the decoding unit 104 is coupled to a second output of the division unit 103, a third input terminal of the decoding unit 104 is coupled to an input terminal of the controller 101 to receive the transmission data, a clock terminal of the decoding unit 104 is coupled to an output terminal of the oscillator 102, an output terminal of the decoding unit 104 is coupled to the drive unit 202.

In the present embodiment of the application, the decoding unit 104 determines the sampling period according to the quotient N and the remainder M, the sampling period includes two kinds of sampling pulse intervals, then data bytes in each frame are sampled according to the two kinds of sampling pulse intervals and then the sampled data bytes are decoded, the above data bytes refer to a plurality of bytes behind the initial byte of each frame, take the standard DMX512 protocol for example, the bit number of the frame start byte are nine, the bit number of each data byte are also nine (wherein, the first bit is 1'b0). Each data byte corresponds to nine sampling pulses, the time width between pulses is controlled by N and M. Wherein, for sampling accuracy, generally the data is sampled at the center position of each bit, i.e. the time interval between the sampling point of the start bit and a falling edge of the start bit of the data byte is (N/2)T, the subsequent sampling pulses interval of the eight data bits is (N+1) T or NT, wherein the number of N+1 is M, the number of N is (9–M), the sampling pulses interval can be set as (N+1) T or NT by a interpolation.

In the embodiment of the present application, the oscillation period of the oscillation signal is counted within a time period of low level bits of a frame start byte to obtain a count value after receiving the control signal, and then a division operation is carried out to the count value to output a quotient and a remainder, and then the data bytes are decoded according to the quotient and the remainder, so the accumulated error can not be produced, and there is no need to enhance the data transmission rate by reducing the decoding error, which improves the accuracy of the decoding, and is simple realization, low cost and good stability.

Figure 5:
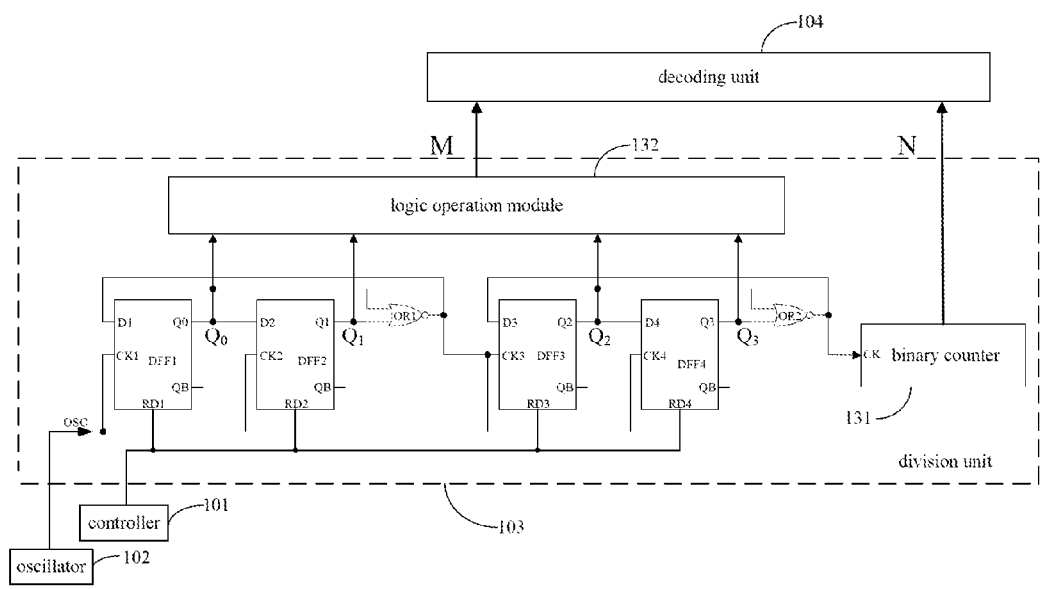
FIG. 5 is an example circuit of a division unit in the transmission protocol decoding device in accordance with an embodiment of the present invention.

FIG. 5 is an example circuit of a decoding unit in the transmission protocol decoding device in accordance with an embodiment of the present invention, for convenience of illustration, only relevant parts related to the present invention are shown.

As an embodiment of the present application, the division unit 103 may be achieved through a divider and a counter, the division circuit may be achieved through a flip-flop, or through other logic devices, the circuit to divide nine can use four D flip-flops, wherein, a D flip-flop DFF1 and a D flip-flop DFF2 from a circuit to divide three, the state transition of the state machine is: 00→01→10→00 . . . .

a D flip-flop DFF3 and a D flip-flop DFF4 also from a circuit to divide three, and the two circuit to divide three consist of the circuit to divide nine.

The division unit 103 includes:

The first D flip-flop DFF1, the second D flip-flop DFF2, the third D flip-flop DFF3, the fourth D flip-flop DFF4, a first NOR gate OR1, a second NOR gate OR2, a binary counter 131 and a logic operation module 132;

A reset terminal RD1 of the first D flip-flop DFF1, a reset terminal RD2 of the second D flip-flop DFF2, a reset terminal RD3 of the third D flip-flop DFF3, a reset terminal RD4 of the forth D flip-flop DFF4 are the control terminal of the division unit 13, a clock input terminal CK1 of the first D flip-flop DFF1, and a clock input terminal CK2 of the second D flip-flop DFF2 are the input terminals of the division unit 13, a trigger terminal D2 of the second D flip-flop DFF2 is coupled to the positive output terminal Q0 of the first D flip-flop DFF1, a first input terminal of the first NOR gate OR1 is coupled to a positive output terminal Q0 of the first D flip-flop DFF1, a second input terminal of the first NOR gate OR1 is coupled to a positive output terminal Q1 of the second D flip-flop DFF2, an output terminal of the first NOR gate OR1 is coupled to a trigger terminal D1 of the first D flip-flop DFF1, a clock input terminal CK3 of the third D flip-flop DFF3, and a clock input terminal CK4 of the forth D flip-flop DFF4, a trigger terminal D4 of the forth D flip-flop DFF4 is coupled to a positive output terminal Q2 of the third D flip-flop DFF3, a first input terminal of the second NOR gate OR2 is coupled to the positive output terminal Q2 of the third D flip-flop DFF3, a second input terminal of the second NOR gate OR2 is coupled to the positive output terminal Q3 of the forth D flip-flop DFF4, a second output terminal of the second NOR gate OR2 is coupled to a trigger terminal D3 of the third D flip-flop DFF3, and an input terminal of the binary counter 131, the output terminal of binary counter 131 is the first output terminal of the division unit 13, the positive output terminal Q0 of the first D flip-flop DFF1, a positive output terminal Q1 of the second D flip-flop DFF2, a positive output terminal Q2 of the third D flip-flop DFF3, the positive output terminal Q3 of the forth D flip-flop DFF4 are coupled respectively to the first input terminal, the second terminal, the third terminal and the forth terminal of the logic operation module 132, the output terminal of the logic operation module 132 is the second output terminal of the division unit 13.

In the present embodiment of the application, the four D flip-flop DFF1-DFF4 count the oscillation signal OSC outputted by the oscillator 102 and then do division nine operation to the count value, and the quotient N is obtained through the binary counter 131, the remainder M is obtained through the logical conversion of the logic operation module 132, the binary representation of the M is $M_3M_2M_1M_0$, The logical conversion formula is:

$$M_0=\overline{Q_2}\cdot\overline{Q_1}\cdot Q_0+\overline{Q_3}\cdot Q_2\cdot \overline{Q_0}$$

$$M_1=Q_3\cdot\overline{Q_2}\cdot\overline{Q_1}+\overline{Q_3}\cdot\overline{Q_0}\cdot(\overline{Q_2}\cdot Q_1+Q_2\cdot\overline{Q_1})$$

$$M_2=\overline{Q_3}\cdot Q_2\cdot(\overline{Q_1}\cdot Q_0+Q_1\cdot\overline{Q_0})+Q_3\cdot\overline{Q_2}\cdot\overline{Q_1}$$

$$M_3=Q_3\cdot\overline{Q_2}\cdot\overline{Q_1}\cdot\overline{Q_0}$$

Thereinto, Q0-Q3 are respective the logic state of the positive output terminals of the D flip-flops DFF1-DFF4, the corresponding tables obtained by logic convention formula are as follow:

| ternary system | | | | decimal system | binary system | | | |
|---|---|---|---|---|---|---|---|---|
| $Q_3$ | $Q_2$ | $Q_1$ | $Q_0$ | | $M_3$ | $M_2$ | $M_1$ | $M_0$ |
| 0 | 0 | 0 | 0 | 0 | 0 | 0 | 0 | 0 |
| 0 | 0 | 0 | 1 | 1 | 0 | 0 | 0 | 1 |
| 0 | 0 | 1 | 0 | 2 | 0 | 0 | 1 | 0 |
| 0 | 1 | 0 | 0 | 3 | 0 | 0 | 1 | 1 |
| 0 | 1 | 0 | 1 | 4 | 0 | 1 | 0 | 0 |
| 0 | 1 | 1 | 0 | 5 | 0 | 1 | 0 | 1 |
| 1 | 0 | 0 | 0 | 6 | 0 | 1 | 1 | 0 |
| 1 | 0 | 0 | 1 | 7 | 0 | 1 | 1 | 1 |
| 1 | 0 | 1 | 0 | 8 | 1 | 0 | 0 | 0 |

In embodiments of the application, the logic operation module 132 may be connected by a plurality of logic gates based on the logical expressions of the remainder M, so it is not described further here.

Figure 6:
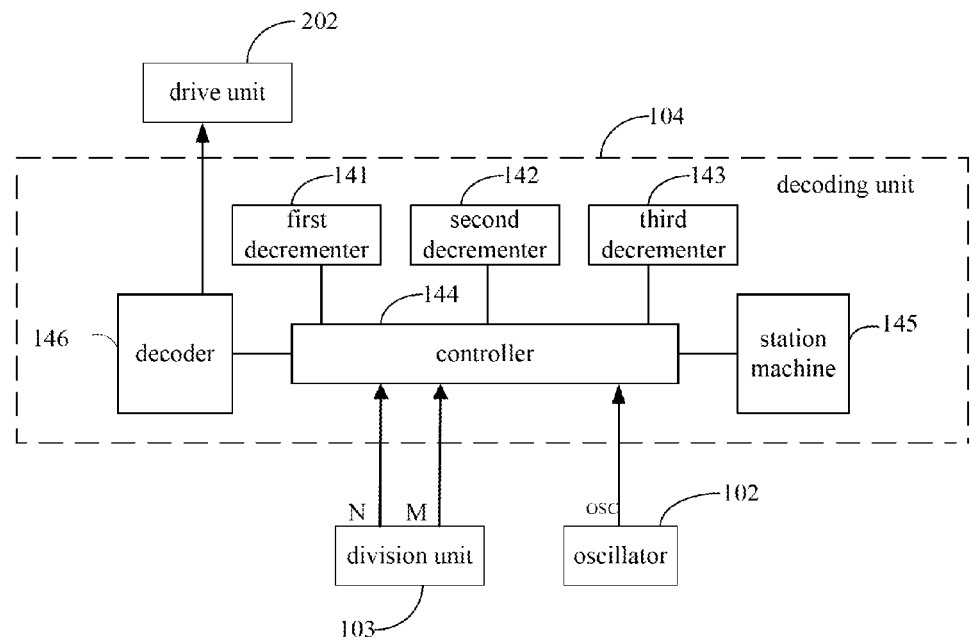
FIG. 6 is an example circuit of a decoding unit in the transmission protocol decoding device in accordance with an embodiment of the present invention.

FIG. 6 is an example circuit of a decoding unit in the transmission protocol decoding device in accordance with an embodiment of the present invention, for convenience of illustration, only relevant parts related to the present invention are shown.

As an embodiment of the present application, the decoding unit 104 includes:

a first decrementer 141, a second decrementer 142, a third decrements 143, a control module 144, a state machine 145 and a decoder 146;

wherein a first input terminal of the control module 144 is a first input terminal of the decoding unit 104, a second input terminal of control module 144 is a second input terminal of the decoding unit 104, a first output terminal of the control module 144 is coupled to an input terminal of the first decrementer 141, a second output terminal of the control module 144 is coupled to an input terminal of the second decrementer 142, a third output terminal of the control module 144 is coupled to an input terminal of the third decrementer 143, an output terminal of the state machine 145 is coupled to a third input terminal of the control module 144, a clock terminal of the control module 144 is a clock terminal of the translation unit, an output terminal of the control module 144 is coupled to a first input terminal of the decoder 146, a second input terminal of the decoder 146 is a third input terminal of the decoding unit 104, an output terminal of the decoder 146 is an output terminal of the decoding unit 104.

In the present embodiment of the present application, the control module 144 generates a first sampling period and a second sampling period according to the quotient N, and then is used to write the bit number j of the data byte into the first decremented 141 and write the received remainder M into the second decremented 142, and then the first sampling period (N+1) T or the second sampling period NT are written to the third decremented 143 according to the result of the first decremented 141 and the second decremented 142, and then the control module 144 generates a sampling pulse according to the decrement result of the third decremented 143, and then the decoder 146 samples the data bytes in each frame in transmission according to the sampling pulse and then decodes the sampled data bytes.

As an embodiment of the present application, the interpolation value of the first sampling period (N+1) T or the second sampling period NT can be arranged by the state machine 145, the state transition diagram of the state machine 145 can be as follow:

0000→0001→0010→0011→0100→0101→0110→0111→1000→00 00 . . . .

For example, the time width is 176T when samples to the start byte, and then the 176T is divided by 9 to obtain N=19, M=5, the binary representation of the M, N are N=5'b10011, M=4'b0101.

When samples the start bit, the sampling point is set to 5'b01001. The subsequent sampling periods of data bits comprises five 5'b10100s and three 5'b10011s. Further, the subsequent sampling periods is distributed in a interpolation manner as far as possible, for example, the distribution of the sampling periods from the start bit to the eighth data bit are as shown in FIG. 7.

The specific sampling process are as follow: the falling edge of each data byte is used as the beginning of the sampling data, the sampling points of start bit is (N/2) T, if M=3, the interpolation is set by state machine, for example, the interval between the second sampling pulse and the first sampling pulse is (N+1) T, the interval between the third sampling pulse and the second sampling pulse is (N+1) T, the interval between the forth sampling pulse and the third sampling pulse is (N+1) T, the interval between the fifth sampling pulse and the forth sampling pulse is NT, the interval between the sixth sampling pulse and the fifth sampling pulse is NT, the interval between the seventh sampling pulse and the sixth sampling pulse is NT, the interval between the eighth sampling pulse and the seventh sampling pulse is NT, the interval between the ninth sampling pulse and the eighth sampling pulse is NT, Understandably, the sampling pulse interval of each sampling pulse can be changed by changing the state transition value of the state machine, for example, the interval between the third sampling pulse and the second sampling pulse is set as NT, the interval between the eighth sampling pulse and the seventh sampling pulse is (N+1) T, each time a sampling pulse is emitted, the first decrementer, the second decrementer, and the third decrementer decrease the data byte bits j, the remainder M, and the sampling period T.

The decrement process is as follow:

In the present embodiment of the application, an initial sampling period (N/2) T is generated according to the quotient N and the period of the oscillation signal OSC, the bit number j (in this example is nine) of the data byte is written to the first decrementer 141, the initial sampling period (N/2) T is written to the third decrementer 143, the first decrementer 141 begins to decrease 1 according to the period of the oscillation signal OSC, and the third decrementer 143 also begins to decrease at the control of the period of the oscillation signal OSC, and outputs a first sampling pulse when the third decrementer 143 is decreased to zero, and then the first sampling period (N+1) T and the second sampling period NT are generated according to the quotient N and the remainder M is written to the second decrementer 142, the first sampling period (N+1) T or the second sampling period NT are written to the third decrementer 143 by the control unit 144 at the control of the state machine 145, the second decrementer 142 decreases 1, when the first sampling period (N+1) T is written to the third decrementer 143 at the control of the state machine 145, and the third decrementer 143 also begins to decrease after being written with the first sampling period (N+1) T or the second sampling period NT, and outputs a second sampling pulse until the third decrementer 143 is decreased to zero, and the first sampling period (N+1) T or the second sampling period NT is written to the third decrementer 143 again until the first decrementer 141 is decreased to zero, and each time when the first sampling period (N+1) T is written to the third decrementer 143, the second decrementer 142 decreases 1, until the second decrementer 142 is decreased to zero, cycling as such, the number of the sampling pulse j is outputted to complete the sampling operation of the whole data byte.

If not using the state machine 145, the third decrementer 143 can firstly be written with the first sampling period (N+1) T, and then determines whether the value of the second decrementer 142 is zero, if the second decrementer 142 is not decreased to zero, the third decrementer 143 is written continually with the first sampling period (N+1) T, until the second decrementer 142 is decreased to zero, and then the second sampling period NT is written to the third decrementer 143, until the first decrementer 141 is decreased to zero.

It means that the sampling of the data bytes is completed, when the first decrementer 141 is decreased to zero.

It should be noted that, if the last one bit of the binary of the N is 1, but M≠0, then M may be decreased 1, and the sampling point of the start bit is [N/2]+1. Wherein, the [N/2] is the integer part.

In the embodiment of the present application, the oscillation period of the oscillation signal is counted within a time period of low level bits of a frame start byte to obtain a count value after receiving the control signal, and then a division operation is carried out to the count value to output a quotient and a remainder, and then the data bytes are decoded according to the quotient and the remainder, so the accumulation error can not be produced, and there is no need to enhance the data transmission rate by reducing the decoding error, which improves the accuracy of the decoding, and is simple realization, low cost and good stability.

What described above are only preferred embodiments of the present disclosure but are not intended to limit the scope of the present disclosure, any modifications, equivalent replacements and improvements etc. made within the spirit and principle of the present invention, should be included in the protection scope of the present invention.

What is claimed is:

1. A transmission protocol decoding method, wherein the method comprises the steps of:
   generating an oscillation signal;
   detecting a frame start signal, and outputting a sampling control signal when the frame start signal is detected;
   counting an oscillation period of the oscillation signal within a time period of low level bits of a frame start byte to obtain a count value after receiving the sampling control signal, and processing a division operation to the count value to output a quotient and a remainder; and
   determining a sampling period according to the quotient and the remainder to generate a sampling pulse, and decoding a data byte of a transmission data according to the sampling pulse, wherein the step of determining a sampling period according to the quotient and the remainder to generate a sampling pulse, and decoding a data byte of a transmission data according to the sampling pulse comprises:
      generating a first sampling period and a second sampling period according to the quotient;
      writing a bit number j of the data byte into a first decrementer, and writing the remainder M into to a second decrementer;
      writing the first sampling period or the second sampling period into a third decrementer according to decrement results of the first decrementer and the second decrementer;
      generating the sampling pulse according to the decrement results of the third decrementer;
      sampling the data bytes of each frame in transmission data according to the sampling pulse, and then decoding the sampled data bytes.

2. A transmission protocol decoding device, wherein the device is coupled to a drive unit and comprises:
   an oscillator configured to generate an oscillation signal;
   a controller configured to detect a frame start signal and output a sampling control signal when the frame start signal is detected, wherein an input terminal of the controller is configured to receive a transmission data;
   a division unit configured to count a oscillation period of the oscillation signal within a time period of low level bits of a frame start byte to obtain a count value after receiving the control signal, and configured to process a division operation to the count value, and then output a quotient and a remainder, wherein a control terminal of the division unit is coupled to an output terminal of the controller, an input terminal of the division unit is coupled to an output terminal of the oscillator; and
   a decoding unit configured to determine a sampling period according to the quotient and the remainder to generate a sampling pulse, and configured to decode a data byte of a transmission data according to the sampling pulse, wherein a first input terminal of the decoding unit is coupled to a first output terminal of the division unit, a second input terminal of the decoding unit is coupled to a second output terminal of the division unit, a third input terminal of the decoding unit is coupled to an input terminal of the controller to receive the transmission data, a clock terminal of the decoding unit is coupled to an output terminal of the oscillator, an output terminal of the decoding unit is coupled to the drive unit.

3. The transmission protocol decoding device of claim 2, wherein the controller is a state machine or a time detecting device.

4. The transmission protocol decoding device of claim 2, wherein the division unit comprises:
   a first D flip-flop, a second D flip-flop, a third D flip-flop, a fourth D flip-flop, a first NOR gate, a second NOR gate, a binary counter and a logic operation module;
   wherein, a reset terminal of the first D flip-flop, a reset terminal of the second D flip-flop, a reset terminal of the third D flip-flop and a reset terminal of the forth D flip-flop are the control terminals of the division unit, a clock input terminal of the first D flip-flop, and a clock input terminal of the second D flip-flop are the input terminals of the division unit, a trigger terminal of the second D flip-flop is coupled to the positive output terminal of the first D flip-flop, a first input terminal of the first NOR gate is coupled to a positive output terminal of the first D flip-flop, a second input terminal of the first NOR gate is coupled to a positive output terminal of the second D flip-flop, an output terminal of the first NOR gate is coupled to a trigger terminal of the first D flip-flop, a clock input terminal of the third D flip-flop, and a clock input terminal of the forth D flip-flop, a trigger terminal of the forth D flip-flop is coupled to a positive output terminal of the third D flip-flop, a first input terminal of the second NOR gate is coupled to the positive output terminal of the third D flip-flop, a second input terminal of the second NOR gate is coupled to a positive output terminal of the forth D flip-flop, a second output terminal of the second NOR gate is simultaneous coupled to a trigger terminal of the third D flip-flop and an input terminal of the binary counter, an output terminal of binary counter is a first output terminal of the division unit, the positive output terminal of the first D flip-flop, the positive output terminal of the second D flip-flop, the positive output terminal of the third D flip-flop and the positive output terminal of the forth D flip-flop are coupled respectively to a first input terminal, a second terminal, a third terminal and a forth terminal of the logic operation module, an output terminal of the logic operation module is the second output terminal of the division unit.

5. The transmission protocol decoding device of claim 2, wherein the decoding unit comprises:

a first decrementer, a second decrementer, a third decrementer, a control module, a state machine and a decoder;
wherein a first input terminal of the control module is a first input terminal of the decoding unit, a second input terminal of the control module is a second input terminal of the decoding unit, a first output terminal of the control module is coupled to an input terminal of the first decrementer, a second output terminal of the control module is coupled to an input terminal of the second decrementer, a third output terminal of the control module is coupled to an input terminal of the third decrementer, an output terminal of the state machine is coupled to a third input terminal of the control module, a clock terminal of the control module is a clock terminal of the translation unit, an output terminal of the control module is coupled to a first input terminal of the decoder, a second input terminal of the decoder is a third input terminal of the decoding unit, an output terminal of the decoder is an output terminal of the decoding unit.

6. A transmission protocol decoding chip, wherein the chip comprises the transmission protocol decoding device of claim 2.

7. A transmission protocol decoding chip, wherein the chip comprises the transmission protocol decoding device of claim 3.

8. A transmission protocol decoding chip, wherein the chip comprises the transmission protocol decoding device of claim 4.

9. A transmission protocol decoding chip, wherein the chip comprises the transmission protocol decoding device of claim 5.

* * * * *